US011756827B2

(12) United States Patent
Horikiri et al.

(10) Patent No.: US 11,756,827 B2
(45) Date of Patent: *Sep. 12, 2023

(54) STRUCTURE MANUFACTURING METHOD AND MANUFACTURING DEVICE, AND LIGHT IRRADIATION DEVICE

(71) Applicant: SUMITOMO CHEMICAL COMPANY, LIMITED, Tokyo (JP)

(72) Inventors: Fumimasa Horikiri, Hitachi (JP); Noboru Fukuhara, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/725,232

(22) Filed: Apr. 20, 2022

(65) Prior Publication Data

US 2022/0246467 A1    Aug. 4, 2022

Related U.S. Application Data

(63) Continuation of application No. 17/311,887, filed as application No. PCT/JP2019/047739 on Dec. 6, 2019, now Pat. No. 11,342,220.

(30) Foreign Application Priority Data

Dec. 10, 2018  (JP) .................. 2018-230995

(51) Int. Cl.
 *H01L 21/768* (2006.01)
 *H01L 21/02* (2006.01)
 *H01L 21/308* (2006.01)

(52) U.S. Cl.
 CPC .. *H01L 21/76825* (2013.01); *H01L 21/02019* (2013.01); *H01L 21/308* (2013.01)

(58) Field of Classification Search
 None
 See application file for complete search history.

(56) References Cited

U.S. PATENT DOCUMENTS 10,115,599 B2    10/2018 Goddard et al.
11,342,220 B2 *   5/2022 Horikiri ............ H01L 21/76825
(Continued)

FOREIGN PATENT DOCUMENTS

JP    H08-213358 A     8/1996
JP    2004-289032 A   10/2004
(Continued)

OTHER PUBLICATIONS

Murata et al., "Photo-electrochemical etching of free-standing GaN wafer surfaces grown by hydride vapor phase epitaxy," Electrochimica Acta, vol. 171, 2015, pp. 89-95.
(Continued)

*Primary Examiner* — Alexander G Ghyka
(74) *Attorney, Agent, or Firm* — Foley & Lardner LLP

(57) ABSTRACT

There is provided a structure manufacturing method, including: preparing a wafer at least whose surface comprises Group III nitride crystal in a state of being immersed in an etching solution containing peroxodisulfate ions; and irradiating the surface of the wafer with light through the etching solution; wherein the group III nitride crystal has a composition in which a wavelength corresponding to a band gap is 310 nm or more, and during irradiation of the light, the surface of the wafer is irradiated with a first light having a wavelength of 200 nm or more and less than 310 nm under a first irradiation condition, and is irradiated with a second light having a wavelength of 310 nm or more and less than a wavelength corresponding to the band gap under a second irradiation condition controlled independently of the first irradiation condition.

3 Claims, 5 Drawing Sheets

(56) References Cited

U.S. PATENT DOCUMENTS

| | | | |
|---|---|---|---|
| 2004/0209194 A1 | 10/2004 | Kume et al. | |
| 2008/0113518 A1* | 5/2008 | Kume | H01L 21/0206 438/746 |
| 2009/0283800 A1 | 11/2009 | Im et al. | |
| 2011/0263128 A1 | 10/2011 | Duncan et al. | |
| 2018/0026159 A1* | 1/2018 | Uematsu | H01L 33/32 257/103 |
| 2019/0198562 A1 | 6/2019 | Schubert et al. | |
| 2020/0161126 A1 | 5/2020 | Monavarian et al. | |

FOREIGN PATENT DOCUMENTS

| | | |
|---|---|---|
| JP | 2007-227450 A | 9/2007 |
| JP | 2009-055056 A | 3/2009 |

OTHER PUBLICATIONS

Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.

Faraz et al., "Atomic Layer Etching: What CanWe Learn from Atomic Layer Deposition?" ECS Journal of Solid State Science and Technology, vol. 4, Issue 6, 2015, pp. N5023-N5032.

International Searching Authority, "International Search Report," issued in connection with International Patent Application No. PCT/JP2019/047739, dated Feb. 25, 2020.

International Searching Authority, "Written Opinion," issued in connection with International Patent Application No. PCT/JP2019/047739, dated Feb. 25, 2020.

International Preliminary Report on Patentability received in International Application No. PCT/JP2019/047739 dated Jun. 24, 2021. (6 pages).

* cited by examiner

STRUCTURE MANUFACTURING METHOD AND MANUFACTURING DEVICE, AND LIGHT IRRADIATION DEVICE

CROSS-REFERENCE TO RELATED APPLICATIONS

The present application is a Continuation of U.S. patent application Ser. No. 17/311,887, filed on Oct. 14, 2021, which claims priority under 37 U.S.C. § 371 to International Patent Application No. PCT/JP2019/047739, filed Dec. 6, 2019, which claims priority to and the benefit of Japanese Patent Application No. 2018-230995, filed on Dec. 10, 2018. The contents of these applications are hereby incorporated by reference in their entireties.

TECHNICAL FIELD

The present disclosure relates to a structure manufacturing method, a manufacturing device, and a light irradiation device.

DESCRIPTION OF RELATED ART

Group III nitrides such as gallium nitride (GaN) are used as materials for manufacturing semiconductor devices such as light emitting devices and transistor, and is also attracting attention as a material for microelectromechanical systems (MEMS).

Photoelectrochemical (PEC) etching has been proposed as an etching technique for Group III nitrides such as GaN (see, for example, Non-Patent Document 1). The PEC etching is a wet etching with less damage than a general dry etching, and is preferable because a device is simple, compared to special dry etching with less damage such as neutral particle beam etching (see, for example, Non-Patent Document 2) and atomic layer etching (see, for example, Non-Patent Document 3).

PRIOR ART DOCUMENT

Non-Patent Document

[Non-Patent Document 1] J. Murata et al., "Photo-electrochemical etching of free-standing GaN wafer surfaces grown by hydride vapor phase epitaxy", Electrochimica Acta 171 (2015) 89-95
[Non-Patent Document 2] S. Samukawa, JJAP, 45 (2006) 2395. [Non-Patent Document 3] T. Faraz, ECS J. Solid Stat. Scie. & Technol., 4, N5023 (2015).

SUMMARY OF THE DISCLOSURE

Problem to be Solved by the Disclosure

As will be described later in detail, by containing peroxodisulfuric acid ion in an etching solution, electrodeless PEC etching that does not require a cathode electrode, an external circuit, or the like can be performed. However, little technical studies have been made so far to favorably perform the electrodeless PEC etching.

An object of the present disclosure is to provide a technique for suitably performing electrodeless PEC etching for a wafer whose surface comprises at least group III nitride crystal.

Means for Solving the Problem

According to an aspect of the present disclosure, there is provided a structure manufacturing method, including:
preparing a wafer at least whose surface comprises Group III nitride crystal in a state of being immersed in an etching solution containing peroxodisulfate ions; and
irradiating the surface of the wafer with light through the etching solution;
wherein the group III nitride crystal has a composition in which a wavelength corresponding to a band gap is 310 nm or more, and
during irradiation of the light, the surface of the wafer is irradiated with a first light having a wavelength of 200 nm or more and less than 310 nm under a first irradiation condition, and is irradiated with a second light having a wavelength of 310 nm or more and less than a wavelength corresponding to a band gap under a second irradiation condition controlled independently of the first irradiation condition.

According to another aspect of the present disclosure, there is provided a structure manufacturing device, including:
a container that stores a wafer at least whose surface comprises Group III nitride crystal in a state of being immersed in an etching solution containing peroxodisulfate ions; and
a light irradiation device that irradiates the surface of the wafer with light through the etching solution;
wherein the Group III nitride crystal has a composition in which a wavelength corresponding to a band gap is 310 nm or more, and
the light irradiation device irradiates the surface of the wafer with a first light having a wavelength of 200 nm or more and less than 310 nm under a first irradiation condition, and irradiates the surface of the wafer with a second light having a wavelength of 310 nm or more and less than a wavelength corresponding to the band gap under a second irradiation condition controlled independently of the first irradiation condition.

According to further another aspect of the present disclosure, there is provided a light irradiation device, used to irradiate a surface of a wafer with light, the wafer being immersed in an etching solution containing peroxodisulfate ions, and at least whose surface comprises Group III nitride crystal,
wherein the Group III nitride crystal has a composition in which a wavelength corresponding to a band gap is 310 nm or more, and
the device irradiates the surface of the wafer with a first light having a wavelength of 200 nm or more and less than 310 nm under a first irradiation condition, and irradiates the surface of the wafer with a second light having a wavelength of 310 nm or more and less than a wavelength corresponding to the band gap under a second irradiation condition controlled independently of the first irradiation condition.

Advantage of the Disclosure

There is provided a technique for suitably performing electrodeless PEC etching for a wafer whose surface comprises at least Group III nitride crystal.

AN EMBODIMENT OF THE PRESENT DISCLOSURE

Figure 1A:
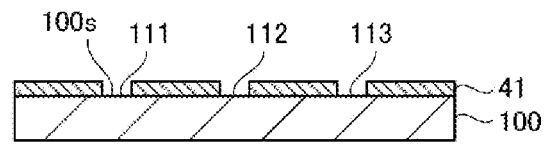
FIGS. 1 (a) to 1 (d) are cross-sectional views schematically illustrating a PEC etching method according to an embodiment of the present disclosure.
Figure 1B:
Figure 1C:
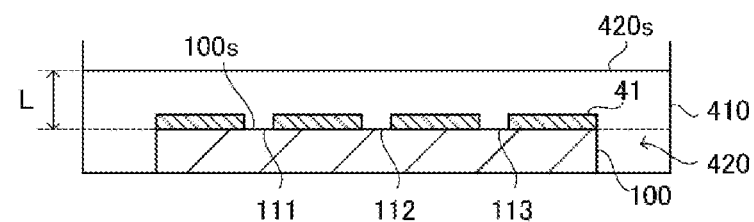

A photoelectrochemical (PEC) etching method according to an embodiment of the present disclosure will be described. Hereinafter, PEC etching is also simply referred to as etching. FIGS. 1 (a) to 1 (d) are cross-sectional views schematically illustrating an etching method according to the present embodiment.

FIG. 1 (a) is used for reference. A wafer 100 having a surface 100s, which is an object to be etched and is a surface to be etched, is prepared. At least the surface (surface layer) 100s of the wafer 100 comprises Group III nitride crystal. Examples of the Group III nitride constituting the surface 100s include gallium nitride (GaN). Examples of the wafer 100 include a GaN substrate, and for example, include an epitaxial substrate in which a GaN layer is epitaxially grown on a base substrate. Examples of the base substrate of such an epitaxial substrate include a GaN substrate, and for example, examples of different types of substrates include a sapphire substrate, a silicon carbide (SiC) substrate, and a silicon (Si) substrate.

Since a dislocation part of the GaN crystal is difficult to be PEC-etched, it is preferable that the dislocation density of GaN constituting the surface 100s is low, from a viewpoint of facilitating the PEC etching. A maximum dislocation density in the surface 100s is preferably less than, for example, $1 \times 10^7 / cm^2$.

The size of the wafer 100 is not particularly limited, but as will be described later, the etching method according to the present embodiment can be easily applied even when the wafer 100 has a large diameter. Therefore, the size of the wafer 100 is preferably, for example, 2 inches (5.08 cm) or more in diameter from a viewpoint of improving productivity.

A plurality of areas to be etched 111 to 113 are defined on the surface 100s in an appearance of being separated from each other. The areas to be etched 111 to 113 are areas where the GaN constituting the surface 100s is etched, by irradiating with ultraviolet (UV) light 431 in a state of being immersed in the etching solution 420, as will be described later.

A light-shielding mask 41 that blocks UV light 431 is formed on the surface 100s. The mask 41 has an opening that exposes the areas to be etched 111 to 113. As a material of the mask 41, for example, a metal material is preferably used, and more specifically, titanium (Ti), chromium (Cr) and the like are preferably used. A thickness of the mask 41 may be, for example, 200 nm or less, specifically, for example, about 100 nm.

Here, three areas to be etched 111 to 113 are illustrated, but the number of areas to be etched may be appropriately changed as necessary. Further, the shape and size of each area to be etched 111 and the like, and an arrangement of a plurality of areas to be etched 111 and the like on the surface 100s, may be appropriately changed as necessary.

FIG. 1 (b) is used for reference. An etching solution 420 is prepared in the container 410. The etching solution 420 contains hydroxide ion ($OH^-$) and peroxodisulfate ion ($S_2O_8^{2-}$), and for example, it is prepared by mixing a 0.01 M aqueous solution of potassium hydroxide (KOH) and a 0.05 M aqueous solution of potassium persulfate ($K_2S_2O_8$) at a ratio of 1:1. The concentration of $OH^-$ and the concentration of $S_2O_8^{2}$ may be appropriately changed as necessary.

FIG. 1 (c) is used for reference. The wafer 100 on which the mask 41 is formed is housed in the container 410 with the surface 100s immersed in the etching solution 420. In this way, the wafer 100 is prepared in a state of being immersed in the etching solution 420.

FIG. 1 (d) is used for reference. The light irradiation device 430 irradiates the surface 100s of the wafer 100 with the UV light 431. "Irradiating the surface 100s of the wafer 100 with the UV light 431" means "irradiating the surface 100s of the wafer 100 with the UV light 431 which is directed toward the surface 100s of the wafer 100". Similarly, "irradiating the wafer 100 with the UV light 431" means "irradiating the wafer 100 with the UV light 431 which is directed toward the wafer 100". Even when the mask 41 is irradiated with the UV light 431, it is the UV light 431 directed toward the surface 100s of the wafer 100 or the UV light 431 directed toward the wafer 100.

In the present embodiment, the surface 100s of wafer 100 is irradiated with the UV light 431 in which a UV light 431a having a wavelength of 200 nm or more and less than 310 nm, and a UV light 431b having a wavelength of 310 nm or more and less than 365 nm are superimposed (synthesized), as the UV light 431. Hereinafter, when the UV light 431a and the UV light 431b are shown together, or when the UV light 431a and the UV light 431b are shown without any particular distinction, both or one of the UV lights 431a and 431b is referred to as the UV light 431.

"UV light 431a having a wavelength of 200 nm or more and less than 310 nm" means that in the UV light 431a, a peak wavelength at which intensity is maximum, is in a range of 200 nm or more and less than 310 nm. "UV light 431b having a wavelength of 310 nm or more and less than 365 nm" means that in the UV light 431b, a peak wavelength peak wavelength at which the intensity is maximum is in a range of 310 nm or more and less than 365 nm.

Figure 5:
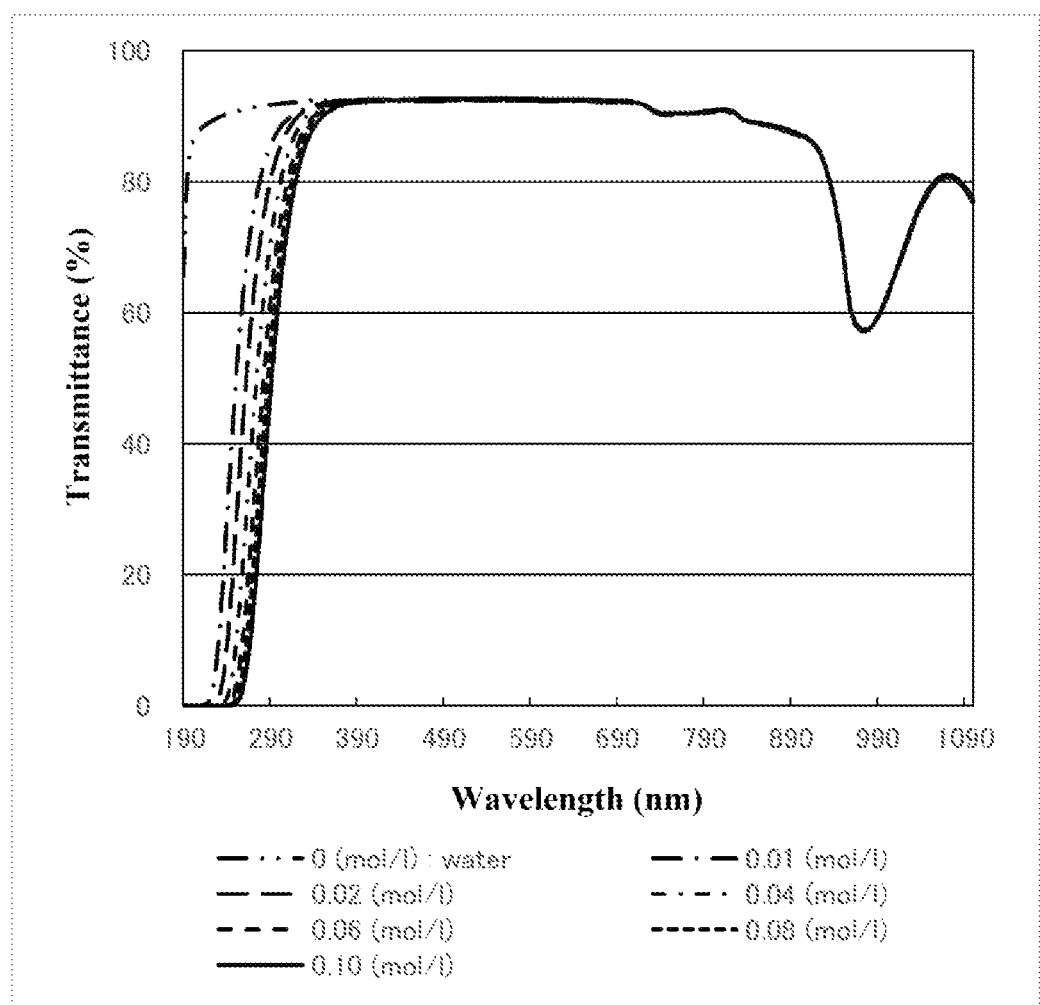
FIG. 5 is a transmittance spectrum of an aqueous potassium persulfate solution.

$S_2O_8^{2-}$ contained in the $K_2S_2O_8$ aqueous solution absorbs UV light having a wavelength of less than 310 nm. By this absorption of UV light, $SO_4^{-*}$ radicals are generated from $S_2O_8^{2-}$, and electrons are consumed by the $SO_4^{-*}$ radicals, as described in detail below. FIG. 5 is a transmittance spectrum of the $K_2S_2O_8$ aqueous solution. The absorption of the $K_2S_2O_8$ aqueous solution in an ultraviolet region changes to some extent depending on a $K_2S_2O_8$ concentration, and the higher the $K_2S_2O_8$ concentration, the greater the absorption even on the long wavelength side. UV light having a wavelength of less than 310 nm can be sufficiently absorbed into the $K_2S_2O_8$ aqueous solution having a practical concentration range. UV light having a wavelength of less than 210 nm is almost completely absorbed (under these measurement conditions). However, when the wavelength is less than 200 nm, the absorption of the UV light into water increases sharply. Accordingly, in order to efficiently generate $SO_4^{-*}$ radicals, it is preferable to irradiate the etching solution 420 with the UV light 431a having a wavelength of 200 nm or more and less than 310 nm.

GaN constituting the surface 100s of the wafer 100 absorbs the UV light having a wavelength of less than 365 nm. This absorption of UV light causes holes to be generated in the GaN, as described in detail below, and GaN is decomposed by the generation of the holes and oxidation of Ga proceeds. However, when the wavelength is less than 310 nm, the absorption of the UV light by $S_2O_8^{2-}$ becomes large. Accordingly, in order to cause the holes to be generated independently of the generation of $SO_4^{-*}$ radicals, it is preferable that the surface 100s of the wafer 100 is irradiated with the UV light 431b having a wavelength of 310 nm or more and less than 365 nm.

Irradiation of the UV lights 431a and 431b is directed toward the surface 100s of the wafer 100 through the etching solution 420. Most of the UV light 431a will be absorbed by the etching solution (etching solution above the wafer 100) 421 arranged above the surface 100s, that is, by a thickness of the etching solution 421 that the UV light 431a passes through before reaching the surface 100s. However, the UV light 431a transmitted without being absorbed by the etching solution 421 above the wafer 100, reaches the surface 100s of the wafer 100, and is absorbed by the GaN that constitutes the surface 100s. On the other hand, the UV light 431b is hardly absorbed by the etching solution 421 above the wafer 100 and is transmitted therethrough, and reaches the surface 100s of the wafer 100 and is absorbed by the GaN constituting the surface 100s.

Next, explanation will be given for a mechanism by which GaN is etched by irradiating the wafer 100 immersed in the etching solution 420 with the UV lights 431a and 431b. When the wafer 100 is irradiated with the UV light 431a or 431b, holes and electrons are generated in pairs in the GaN constituting the surface 100s. GaN is decomposed into $Ga^{3+}$ and $N_2$ by the generated holes (Chemical formula 1), and further, $Ga^{3+}$ is oxidized by $OH^-$ to generate gallium oxide ($Ga_2O_3$) (Chemical formula 2). Then, the generated $Ga_2O_3$ is dissolved by KOH aqueous solution contained in the etching solution 420. In this way, PEC etching of GaN is performed. Oxygen is generated when the generated holes react with water and the water is decomposed (Chemical formula 3).

[Chemical Formula 1]

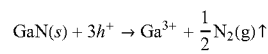

[Chemical Formula 2]

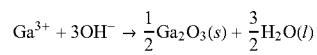

[Chemical Formula 3]

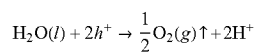

Further, $K_2S_2O_8$ is dissolved in water to generate $S_2O_8^{2-}$ (Chemical formula 4), and $S_2O_8^{2-}$ is irradiated with the UV light 431a to generate $SO_4^{-*}$ radicals (Chemical formula 5). The electrons generated in pairs with the holes react with water together with $SO_4^{-*}$ radicals and the water is decomposed, to generate hydrogen (Chemical formula 6). In this way, according to the PEC etching of the present embodiment, by using $SO_4^{-*}$ radicals, it is possible to consume electrons generated in pairs with holes in GaN.

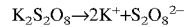 [Chemical formula 4]

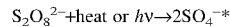 [Chemical formula 5]

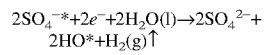 [Chemical formula 6]

As a method for performing PEC-etching to GaN, a method of using GaN as an anode electrode and additionally using a cathode electrode and an external circuit, is also known (this method is referred to as electrodeed PEC-etching hereafter). In the electrodeed PEC etching, electrons generated in pairs with holes in GaN are consumed by flowing them to the cathode electrode through the external circuit. Also, in the electrodeed PEC etching, it takes time and effort to form the cathode electrode and the external circuit, and it takes time and effort to form a seal structure so that a probe connected to the anode electrode (GaN) and the etching solution do not come into contact (short circuit).

In contrast, the PEC etching method according to the present embodiment can be performed in a simple manner by immersing an entire wafer 100 in the etching solution 420, and does not require the formation of the cathode electrode, the external circuit, and the seal structure. Accordingly, the PEC etching method according to the present embodiment can be easily performed as compared with the electrodeed PEC etching. Further, since the PEC etching method according to the present embodiment can be performed in a simple manner by immersing the entire wafer 100 in the etching solution 420, it can be preferably used for applications such as entirely etching the surface 100s of a large-diameter wafer 100 having a diameter of 2 inches or more. The PEC etching method according to the present embodiment can be referred to as electrodeless PEC etching as opposed to electrodeed PEC etching.

Next, a preferable embodiment for improving an etching uniformity among regions to be etched 111 to 113 will be described. The regions to be etched 111 to 113 are dispersedly arranged on the surface 100s of the wafer 100. As the wafer 100 has a large diameter, an overall range in which the regions to be etched 111 to 113 are arranged becomes wide. Due to the widening of the overall range in which the regions to be etched 111 to 113 are arranged, it becomes difficult to uniformly etch the regions to be etched 111 to 113.

As illustrated in FIG. 1 (c) or FIG. 1 (d), the wafer 100 is preferably housed in the container 410 so that the surface 100s of the wafer 100 is parallel (horizontal) to the surface 420s of the etching solution 420. Here, "Parallel" between the surface 100s of the wafer 100 and the surface 420s of the etching solution 420 means that an angle formed by the surface 100s of the wafer 100 and the surface 420s of the etching solution 420 is within a range of 0°±2°.

In this way, a distance (depth) of the etching solution 420 from the surface 420s, that is, a thickness of the etching solution 421 above the wafer 100 can be same among all the regions to be etched 111 to 113. Thereby, it is possible to suppress variations in the supply state of $OH^-$ and $S_2O_8^{2-}$ (or $SO_4^{-*}$ radicals) supplied by diffusion from the etching solution 421 above the wafer 100 to the regions to be etched 111 to 113. Therefore the uniformity of etching within the surface 100s of the wafer 100 can be improved.

Further, due to the same thickness of the etching solution 421 above the wafer 100, the absorption of the UV light 431a by $S_2O_8^{2-}$ shown in (Chemical formula 5) becomes uniform in all the regions to be etched 111 to 113, and the generation of $SO_4^-{}^*$ radicals becomes uniform.

The distance L from the surface 100s of the wafer 100 to the surface 420s of the etching solution 420 is preferably, for example, 5 mm or more and 100 mm or less. When the distance L is excessively short, a supply state of $OH^-$ and $S_2O_8^{2-}$ (or $SO_4^-{}^*$ radicals) diffused and supplied from the etching solution 421 above the wafer 100 to the regions to be etched 111 to 113 varies widely. Therefore, the distance L is preferably, for example, 5 mm or more. Further, when the distance L is excessively long, the container 410 becomes excessively large, and a total amount of the etching solution 420 also becomes excessively large. Therefore, the distance L is preferably 100 mm or less, for example. Since the thickness of the mask 41 is as thin as 200 nm or less, for example, the distance L from the surface 100s of the wafer 100 to the surface 420s of the etching solution 420 may be considered as a distance from the surface of the mask 41 to the surface 420s of the etching solution 420.

In addition, when the distance L is excessively short, the absorption of the UV lights 431a and 431b on the surface 100s of the wafer 100 becomes dominant from the viewpoint of supplying $SO_4^-{}^*$ radicals, and excessive electrons are supplied and $SO_4^-{}^*$ radicals are insufficient. On the other hand, When the distance L is excessively long, the amount of the etching solution 421 that absorbs the UV light 431a above the wafer 100 and deteriorates, becomes excessively large, and utilization efficiency of the etching solution 420 deteriorates. Therefore, the distance L is preferably adjusted to a distance that does not deteriorate the utilization efficiency of the etching solution 420 while appropriately supplying holes and $SO_4^-{}^*$ radicals. From such a viewpoint, the distance L is preferably, for example, 5 mm or more and 100 mm or less.

Irradiation of the UV light 431 is preferably performed, with the wafer 100 and the etching solution 420 (at least, the etching solution 421 above the wafer 100) in a stationary state. Thereby, the supply state of $OH^-$ and $S_2O_8^{2-}$ (or $SO_4^-{}^*$ radicals) to each of the regions to be etched 111 to 113 is prevented from fluctuating due to the movement of the etching solution 420. Therefore, the uniformity of etching within the surface 100s of the wafer 100, can be improved.

The irradiation of the UV light 431 is preferably performed perpendicularly to each of the surfaces of the regions to be etched 111 to 113 from a surface 420s side of the etching solution 420, that is, from an upper side. Here, "perpendicularly" to each of the surfaces of the regions to be etched 111 to 113, that is, to the surface 100s of the wafer 100, means that an angle formed by the UV light 431 with respect to the surface 100s of the wafer 100 is in a range of 90°±2°.

Thereby, depth directions of the recesses 121 to 123 formed in each of the regions to be etched 111 to 113 can be aligned perpendicularly. Therefore, the uniformity of etching within the surface 100s of the wafer 100 can be improved.

It is more preferable that the UV light 431 used to irradiate each of the regions to be etched 111 to 113 is a parallel light in which the directions of all the light rays are aligned perpendicularly, from a viewpoint of efficiently performing irradiation of the light to each deep position of the formed recesses 121 to 123, etc. However, it is acceptable even when it is not the parallel light (even if it is convergent light or diffused light). "irradiation is performed perpendicularly" means that in irradiating the regions to be etched 111 to 113 with the UV light 431, the intensity of an irradiation component perpendicularly to the surface 100s is the highest. Preferably irradiation of at least one of the UV lights 431a and 431b is performed perpendicularly and more preferably irradiation of both lights is performed perpendicularly. Further, as described above, the UV light 431a is absorbed by the etching solution 421 above the wafer 100. To make the generation of $SO_4^-{}^*$ radicals uniform, it is preferable that the distance of pass of the UV light 431a through the etching solution 421 before reaching each of the regions to be etched 111 to 113 is equal. Then, to improve the utilization efficiency of the UV light 431a, it is preferable that the distance of pass of the UV light 431a through the etching solution 421 before reaching each of the regions to be etched 111 to 113 is short. From this viewpoint, it is particularly preferable that the irradiation of the UV light 431a is performed perpendicularly.

Next, a preferable embodiment of improving a flatness of etching for the regions to be etched 111 to 113 will be described. It is preferable that each of the etched regions 111 to 113 is intermittently irradiated with the UV light 431, that is, irradiated with the UV light 431 as chopped light. Thereby, $Ga_2O_3$ generated during an irradiation period of the UV light 431 is dissolved during a non-irradiation period of the UV light 431, and this process is repeated. That is, $Ga_2O_3$ is formed very thinly and the very thinly formed $Ga_2O_3$ is dissolved, and this process is repeated. Thereby, the flatness of the surface formed by etching can be improved, compared to a case where $Ga_2O_3$ is thickly formed by continuous irradiation of the UV light 431 and all of the thickly formed $Ga_2O_3$ is dissolved at once. Such intermittent irradiation may be performed using, for example, a chopper, or may be performed, for example, by switching a light source on and off. By performing the intermittent irradiation, electrons accumulated in the wafer 100 during the irradiation period can be consumed by non-radiative recombination or the like using the non-irradiation period.

Preferably at least one of the UV lights 431a and 431b is the chopped light, and more preferably both are the chopped lights. Chopping conditions for the UV lights 431a and 431b are controlled independently of each other and may be different from each other as described later.

Figure 1D:
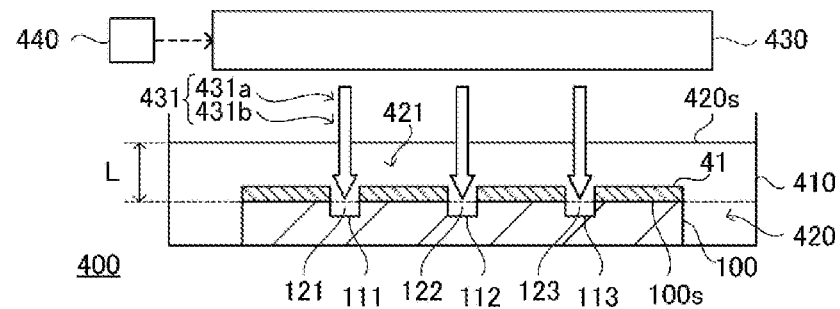

The etching method according to the present embodiment is preferably used as a method for manufacturing a structure, which is a method for forming various structures on the wafer 100 by PEC etching. A PEC etching device 400, which is a structure manufacturing apparatus used in such a structure manufacturing method, includes a container 410, a light irradiation device 430, and a control device 440, as illustrated in FIG. 1(d). The control device 440 includes a storage device that stores programs and data for controlling various devices so as to perform a predetermined operation by the various devices such as the light irradiation device 430 included in the PEC etching device 400, and a CPU that reads and executes the programs etc. from the storage device, and for example, it is composed of a personal computer. A device that combines the light irradiation device 430 and the control device 440 may be regarded as a light irradiation device.

Figure 2A:
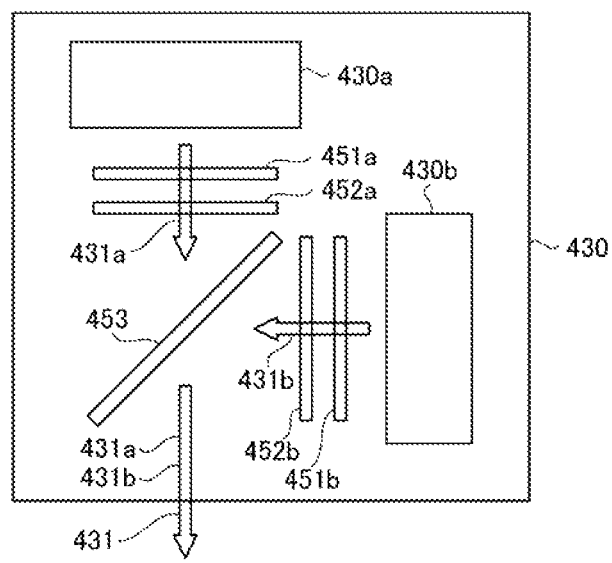
FIGS. 2 (a) and 2 (b) are schematic views illustrating an example and schematic views illustrating another example of a configuration of a light irradiation device used in the PEC etching method according to an embodiment.
Figure 2B:
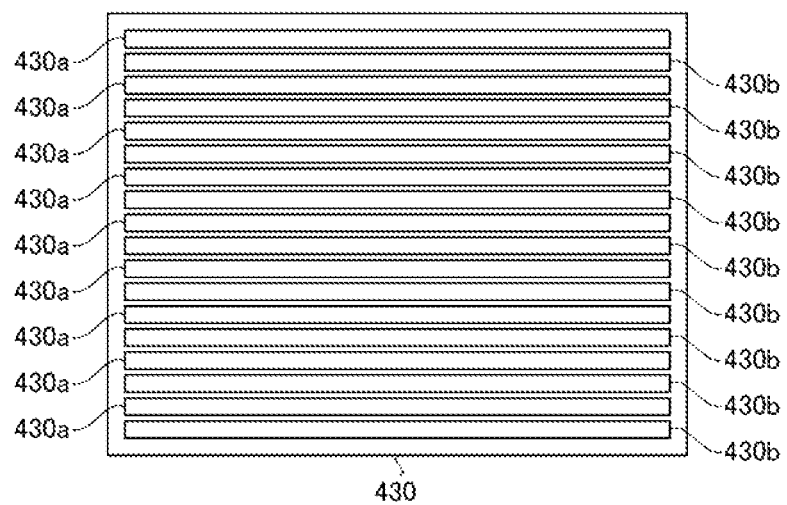
Figure 3A:
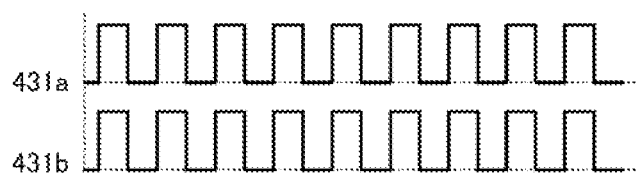
FIGS. 3 (a) to 3 (e) are timing charts that conceptually exemplify chopping conditions for UV lights 431a and 431b used for irradiation in the PEC etching method according to an embodiment.
Figure 3B:
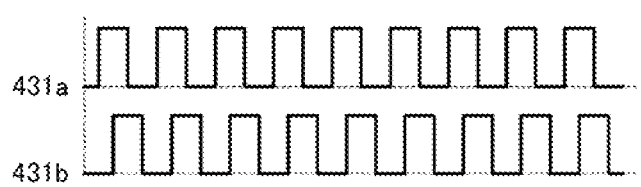
Figure 3C:
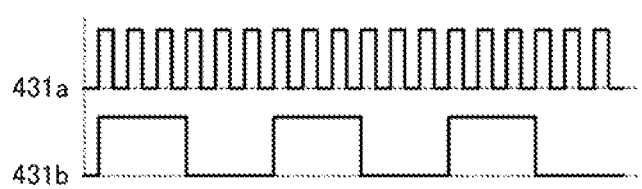
Figure 3D:
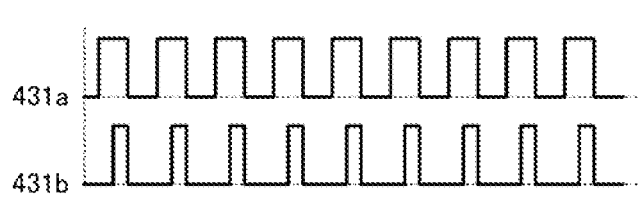
Figure 3E:
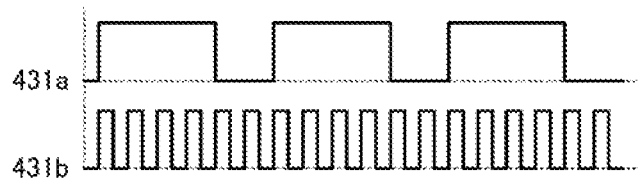

The light irradiation device 430 includes a light source that emits UV light 431 and an optical device that is appropriately arranged as necessary and guides the UV light 431 emitted from the light source so as to irradiate the wafer 100. FIG. 2 (a) is a schematic view illustrating an example of a configuration of the light irradiation device 430. The light irradiation device 430 of this example includes a light source 430a that emits UV light 431a and a light source 430b that emits UV light 431b as light sources. As the light source 430a, it is preferable to use a light source (hereinafter, referred to as a plasma emission light source) that converts ultraviolet rays (vacuum ultraviolet rays) generated by plasma emission into UV light having a predetermined wavelength by a phosphor. It is also possible to use a semiconductor light emitting element such as an LED as the light source 430a. However, the semiconductor light emitting element is not efficient as the light source 430a because light extraction efficiency drops sharply at a short wavelength. On the other hand, in a wavelength range corresponding to the light source 430b, it is easy to obtain sufficient light extraction efficiency and high light intensity in the semiconductor light emitting element. Therefore, it is preferable to use a semiconductor light emitting element as the light source 430b. It is also possible to use a plasma emission light source as the light source 430b. It is also possible to use a mercury lamp as at least one of the light source 430a and the light source 430b. However, since the mercury lamp has features such as a large heat loss and a high environmental load, it is preferable to use the plasma light source or the semiconductor light emitting element.

The UV light 431a emitted from the light source 430a is transmitted through a light intensity adjuster (for example, an attenuation filter) 451a that adjusts a light intensity of the UV light 431a and a chopper 452a that chops the UV light 431a, and is incident on one surface of the half mirror 453. The UV light 431b emitted from the light source 430b is transmitted through a light intensity adjuster (for example, an attenuation filter) 451b that adjusts a light intensity of the UV light 431b and a chopper 452b that chops the UV light 431b, and is incident on the other surface of the half mirror 453.

The UV light 431a transmitted through the half mirror 453 and the UV light 431b reflected by the half mirror 453 are superimposed. According to this example, in this way, the same region on the surface 100s of the wafer 100 is irradiated with the UV light 431 including the UV lights 431a and 431b. The UV light 431 may also be obtained by superimposing the UV light 431a reflected by the half mirror 453 and the UV light 431b transmitted through the half mirror 453.

According to this example, it is possible to control (set) operating conditions for the light source 430a, light intensity conditions for the UV light 431a, chopping conditions for the UV light 431a, and operating conditions for the light source 430b, light intensity conditions for the UV light 431b, and chopping conditions for the UV light 431b, independently of each other. The light intensity conditions include at least a magnitude of the light intensity. The chopping conditions include at least one of the chopping frequency, phase, and duty ratio.

In this way, the surface 100s of the wafer 100 is irradiated with the UV light 431a under the irradiation conditions for UV light 431a, and irradiation of the UV light 431b can be performed under the irradiation conditions for the UV light 431b controlled independently of the irradiation conditions for the UV light 431a. The irradiation conditions include at least one of the light intensity conditions and the chopping conditions. The irradiation conditions (magnitude of light intensity, chopping frequency, phase, duty ratio, etc.) for the UV lights 431a and 431b can be appropriately adjusted by experiments. Further, the peak wavelengths of the UV lights 431a and 431b may also be appropriately adjusted by experiments. The independently controlled irradiation conditions for the UV light 431a and the irradiation conditions for the UV light 431b (at least some of these conditions) may result in matching. The irradiation conditions may include other conditions such as light intensity conditions and chopping conditions, if necessary.

Here, an embodiment in which the light intensity conditions for the UV lights 431a and 431b are adjusted by light intensity adjusters (for example, attenuation filters) 451a and 451b arranged outside the light sources 430a and 430b, has been exemplified. However, the adjustment of the light intensity is not particularly limited to the method of this example. For example, the light intensity conditions for the UV lights 431a and 431b may be adjusted by outputs of the light sources 430a and 430b, respectively.

Here, an embodiment in which the chopping conditions for the UV lights 431a and 431b are adjusted by the choppers 452a and 452b arranged outside the light sources 430a and 430b, has been exemplified. However, the adjustment of the chopping conditions is not particularly limited to the method of this example. For example, the chopping conditions for the UV lights 431a and 431b may be adjusted by on/off operation of the light sources 430a and 430b, respectively.

As a method of superimposing the UV lights 431a and 431b, a method of using a half mirror was exemplified. However, the superimposition of the UV lights 431a and 431b is not particularly limited to the method of this example, and may be performed by various methods of superimposing two lights. For example, a method utilizing polarization characteristics, wavelength characteristics, or the like may be used. Irradiation of the UV light 431a emitted from the light source 430a and the UV light 431b emitted from the light source 430b may be performed onto the surface 100s of the wafer 100 from different directions, and the UV light 431a and the UV light 431b may be superimposed on the surface 100s.

FIG. 2 (b) is a schematic view illustrating another example of the configuration of the light irradiation device 430, and illustrates a plan view of the light irradiation device 430. The light irradiation device 430 of this example constitutes a planar light source that emits both the UV lights 431a and 431b, by alternately arranging a plurality of light sources 430a that emit UV light 431a and light sources 430b that emit UV light 431b in a plane. Each of the UV light 431a emitted from the light source 430a and the UV light 431b emitted from the light source 430b travels with a certain degree of spread so that they are superimposed on the surface 100s of the wafer 100. According to this example, in this way, the same region on the surface 100s of the wafer 100 can be irradiated with the UV light 431 including the UV lights 431a and 431b. The irradiation conditions for the UV lights 431a and 431b can be adjusted according to the operating conditions for the light sources 430a and 430b, respectively. A plurality of light sources 430a and 430b may be alternately arranged in a checkerboard shape.

It is also possible to use the light irradiation device 430 configured to have one light source that emits light that includes both wavelength ranges of the UV lights 431a and 431b, then, separate the light emitted from the light source into the UV lights 431a and 431b, adjust irradiation conditions for each of the separated UV lights 431a and 431b, and thereafter, irradiate the wafer 100 with the UV light 431 on which the UV lights 431a and 431b are superimposed.

The light irradiation device 430 may include various optical members, if necessary, so that the wafer 100 is irradiated with the UV light 431 under predetermined conditions. Various optical members are not limited to those described above, and may include: for example, various lenses, various mirrors, an intensity distribution adjuster for obtaining a predetermined irradiation intensity distribution in an irradiation cross section on the wafer 100, a cross-section shaper for obtaining a predetermined irradiation cross-section shape, a scanner that moves the irradiated cross section to a predetermined position on the wafer 100, a parallel optical system for obtaining a parallel light, a filter for adjusting a wavelength of the emitted light, etc.

The irradiation cross-sectional shape of the UV light 431 which is used for irradiation to the wafer 100, may be shaped into a predetermined pattern, for example, using a digital micromirror device (DMD).

As described above, according to the present embodiment, the surface 100s of the wafer 100 is irradiated with the UV light 431a having a wavelength of 200 nm or more and less than 310 nm through the etching solution 420 under the irradiation conditions for the UV light 431a, and also the surface 100s of the wafer 100 is irradiated with the UV light 431b having a wavelength of 310 nm or more and less than 365 nm under irradiation conditions for the UV light 431b controlled independently of the irradiation conditions for the UV light 431a.

As described above, the irradiation conditions for the UV light 431a have a great influence on the generation of $SO_4^{-*}$ radicals from $S_2O_8^{2-}$ contained in the etching solution 420. On the other hand, the irradiation conditions for the UV light 431b have a great influence on the generation of holes in the GaN constituting the surface 100s of the wafer 100. According to the present embodiment, by independently controlling the irradiation conditions for the UV light 431a and the irradiation conditions for the UV light 431b, it is possible to independently adjust the generation of $SO_4^{-*}$ radicals caused by the irradiation of the UV light 431a and the generation of the holes caused by the irradiation of the UV light 431b.

The balance between the irradiation conditions for the UV light 431a and the irradiation conditions for the UV light 431b can vary for properly performing PEC etching under predetermined etching conditions (for example, predetermined flatness, predetermined etching rate, etc.), depending on the concentration of $S_2O_8^{2-}$ contained in the etching solution 420, the thickness (distance L) of the etching solution 421 above the wafer 100, and the like. According to the present embodiment, by independently controlling the irradiation conditions for the UV light 431a and the irradiation conditions for the UV light 431b, it becomes easy to properly perform PEC etching.

As described above, the present embodiment provides a technique for properly performing electrodeless PEC etching for the wafer 100 whose surface comprises at least a Group III nitride crystal.

The irradiation conditions include at least one of the light intensity condition and the chopping condition. By controlling the light intensity condition for the UV light 431a and the light intensity condition for the UV light 431b independently of each other, it becomes easy to adjust the balance between the amount of the $SO_4^{-*}$ radicals generated by the irradiation of the UV light 431a and the amount of the holes generated by the irradiation of the UV light 431b.

As described above, in order to improve the flatness of the etching, it is preferable that the UV light 431 is a chopped light. However, as described with reference to (Chemical formula 1) to (Chemical formula 6), the PEC etching (electrodeless PEC etching) according to the present embodiment involves a complicated phenomenon such that the $SO_4^{-*}$ radicals are generated, the holes are generated in the GaN, the electrons are consumed by the $SO_4^{-*}$ radicals, etc., and further a behavior may vary depending on the concentration of $S_2O_8^{2-}$ contained in the etching solution 420, the thickness (distance L) of the etching solution 421 above the wafer 100, and the like. Accordingly, it is difficult to perform optimum etching by simply chopping an entire UV light 431, that is, by simply chopping the UV lights 431a and 431b under the same conditions at all times. Chopping conditions can also have influence on the properties other than the etching flatness.

In the present embodiment, the chopping conditions such as chopping frequency, phase, and duty ratio can be controlled independently for each of the UV lights 431a and 431b. Therefore, the chopping conditions can be finely set according to the concentration of the $S_2O_8^{2-}$ contained in the etching solution 420, the thickness (distance L) of the etching solution 421 above the wafer 100, and the like. For example, it is possible to shift the timing of the $SO_4^{-*}$ radical generation caused by the irradiation of the UV light 431a and the timing of the generation of the holes caused by the irradiation of the UV light 431b, by a predetermined period.

As a relationship between the chopping conditions for the UV light 431a and the chopping conditions for the UV light 431b, there may be various types depending on a situation. FIG. 3 (a) to 3 (e) are timing charts that conceptually exemplify some types of the relationship of the chopping conditions for the UV lights 431a and 431b.

FIG. 3 (a) exemplifies a type in which the chopping condition for the UV light 431a and the chopping condition for the UV light 431b have the same chopping frequency and duty ratio and the same phase (in-phase). FIG. 3 (b) exemplifies a type in which the chopping frequency and the duty ratio are the same and the phases are out of phase (not in phase) between the chopping condition for the UV light 431a and the chopping condition for the UV light 431b. FIG. 3 (c) exemplifies a type in which the chopping frequency is different and the duty ratio is the same between the chopping condition for the UV light 431a and the chopping condition for the UV light 431b. FIG. 3 (d) exemplifies a type in which the chopping frequency is the same but the duty ratio is different between the chopping condition for the UV light 431a and the chopping condition for the UV light 431b. FIG. 3 (e) exemplifies a type in which the chopping frequency is different and the duty ratio is different either between the chopping condition for the UV light 431a and the chopping condition for the UV light 431b.

Modified Example

Next, a modified example of the above-described embodiment will be described. This modified example is different from the above-described embodiments in the point that the wafer 100 is irradiated with the light 431 in which the light 431c having a wavelength of 365 nm or more and less than 600 nm is superimposed on the UV lights 431a and 431b. In this modified example, the light 431c including a visible light region is superimposed, and therefore the expression "light 431" is used instead of the expression "UV light 431" in the above-described embodiment.

The "light 431c having a wavelength of 365 nm or more and less than 600 nm" means that a peak wavelength at which the intensity is maximum is in a range of 365 nm or more and less than 600 nm in the light 431c. A wavelength range corresponding to the light 431c is selected as a wavelength range capable of exciting a defect exhibiting light emission that exists in the GaN crystal constituting the surface 100s of the wafer 100. Examples of such defects include those exhibiting yellow light emission having a wavelength of about 600 nm. In such a defect, the hole disappears in a short life, and therefore the PEC etching does not easily proceed. Therefore, in this modified example, additional irradiation of the light 431c is performed to promote the excitation of the holes in such a defect. This prevents the PEC etching from becoming difficult to proceed due to such a defect.

Figure 4A:
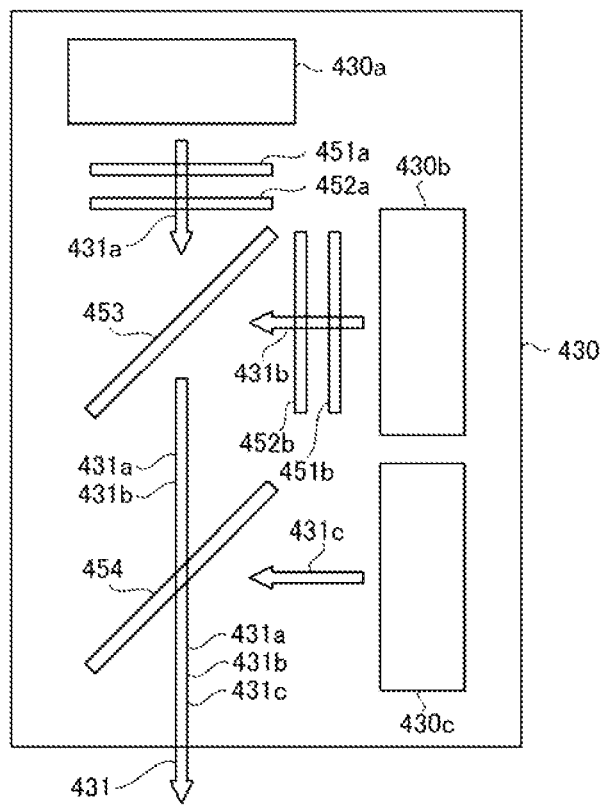
FIGS. 4 (a) and 4 (b) are schematic views illustrating an example and schematic views illustrating another example of a configuration of a light irradiation device used in the PEC etching method according to a modified example of an embodiment.
Figure 4B:
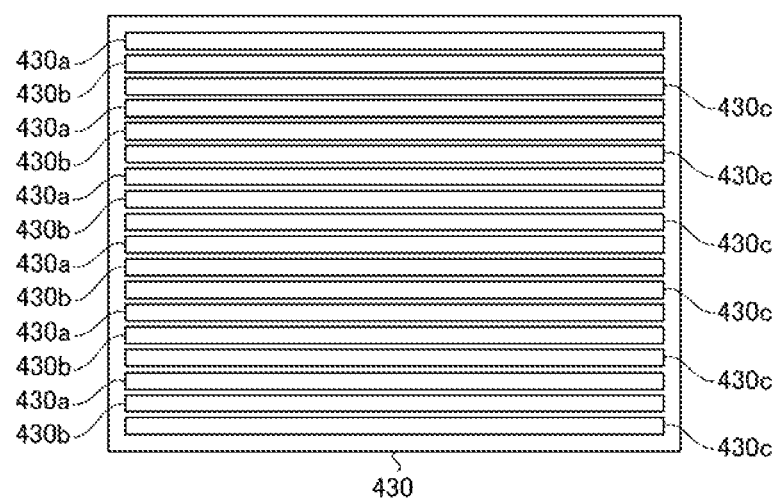

FIG. 4 (a) is a schematic view illustrating an example of the configuration of the light irradiation device 430 according to this modified example. In the light irradiation device 430 of the modified example, the UV light 431a emitted from the light source 430a and in which the light intensity condition and the chopping condition are adjusted, and the UV light 431b emitted from the light source 430b and in which the light intensity condition and the chopping condition are adjusted, are superimposed on each other with a half mirror 453. This point is the same as the light irradiation device 430 illustrated with reference to FIG. 2 (a) in the above embodiment.

In the light irradiation device 430 of this example, the UV lights 431a and 431b superimposed on each other with the half mirror 453 are incident on one surface of the member 454 that transmits the UV lights 431a and 431b and reflects the light 431c. Further, the light 431c emitted from the light source 430c is incident on the other surface of the member 454. For example, a semiconductor light emitting element is used as the light source 430c.

The UV lights 431a and 431b transmitted through the member 454 and the UV light 431b reflected by the member 454 are superimposed on each other. According to this example, in this way, the same region on the surface 100s of the wafer 100 can be irradiated with the light 431 including the UV light 431a, the UV light 431b, and the light 431c. The light 431 may also be obtained by superimposing the UV lights 431a and 431b reflected by the member 454 and the light 431c transmitted through the member 454, using the member 454 that reflects the UV lights 431a and 431b and transmits the light 431c. The surface 100s of the wafer 100 may be irradiated from different directions by the UV light 431a emitted from the light source 430a, the UV light 431b emitted from the light source 430b, and the UV light 431c emitted from the light source 430c which are superimposed on the surface 100s.

The irradiation condition for the light 431c can be controlled (set) independently of the irradiation condition for the UV light 431a and the irradiation condition for the UV light 431b. Therefore, a preferable condition for exciting the above-described defect can be set as the irradiation condition for the light 431c. The irradiation condition for the light 431c (magnitude of light intensity, etc.) can be appropriately adjusted by experiments. Further, the peak wavelength of the light 431c may also be appropriately adjusted by experiments.

FIG. 4 (b) is a schematic view illustrating another example of the configuration of the light irradiation device 430 and a plan view illustrating the light irradiation device 430, according to this modified example. In the light irradiation device 430 of this example, a plurality of light sources 430a that emit UV light 431a, light sources 430b that emit UV light 431b, and light sources 430c that emit light 431c are repeatedly arranged side by side in a plane (a plurality of units with the light sources 430a, 430b, and 430c as one set are arranged side by side), thereby constituting a planar light source that emits the UV light 431a, UV light 431b, and light 431c.

Each of the UV light 431a emitted from the light source 430a, the UV light 431b emitted from the light source 430b, and the light 431c emitted from the light source 430c proceeds with a certain degree of spread, and therefore they are superimposed on each other on the surface 100s of the wafer 100. According to this example, in this way, the same region on the surface 100s of the wafer 100 can be irradiated with the light 431 including the UV light 431a, the UV light 431b, and the light 431c. The irradiation conditions for the UV light 431a, the UV light 431b, and the light 431c can be adjusted according to the operating conditions for the light sources 430a, 430b, and 430c, respectively.

As described above, according to this modified example, since the surface 100s of the wafer 100 is irradiated with the light 431c together with the UV lights 431a and 431b, it is possible to prevent the PEC etching from becoming difficult to proceed due to the above-described defect.

Other Embodiments

As described above, the embodiments and the modified examples of the present disclosure have been specifically described. However, the present disclosure is not limited to the above-described embodiments and modified examples, and various modifications, improvements, combinations, and the like can be made without departing from the gist thereof.

In the above description, GaN has been exemplified as the Group III nitride constituting the surface 100s of the wafer 100. However, the PEC etching technique described in the above-described embodiment and modified example is not limited to the PEC etching of GaN, and is also preferably applied to the PEC etching of other Group III nitride of GaN. Impurities such as conductive type determining impurities may be added to the Group III nitride constituting the surface 100s of the wafer 100, if necessary.

The Group III element contained in the Group III nitride is at least one of aluminum (Al), gallium (Ga) and indium (In). The concept of the PEC etching for Al component or In component in the Group III nitride, is the same as the concept for the Ga component described with reference to (Chemical formula 1) and (Chemical formula 2). That is, the PEC etching can be performed, by making an oxide of Al or an oxide of In generated by generating the holes by irradiation with the UV light 431b (or 431a), and dissolving these oxides. The peak wavelength of the UV light 431b may be appropriately changed depending on the composition of the Group III nitride to be etched.

In the above description, an embodiment in which a mask 41 having an opening for exposing a region to be etched 111 or the like is formed on the wafer 100, has been exemplified. In principle, maskless PEC etching can be performed by shaping (patterning) an irradiation cross section of the UV light 431 into an irradiation cross section for irradiating only the region to be etched 111 or the like. For example, DMD can be used for shaping the irradiation cross section.

In the above description, an etching solution in which 0.01 M KOH aqueous solution and 0.05 M $K_2S_2O_8$ aqueous solution are mixed at a ratio of 1:1, has been exemplified. However, the liquid concentration and the mixing ratio can be arbitrarily set as long as the ratio of the UV light 431a used for radical generation and hole generation in the GaN can be adjusted from a transmittance of the $K_2S_2O_8$ aqueous solution.

<Preferable Aspect of the Present Disclosure>

Preferable aspects of the present disclosure will be supplementarily described hereafter.

(Supplementary Description 1)

There is provided a structure manufacturing method, including:

preparing a wafer at least whose surface comprises Group III nitride crystal in a state of being immersed in an etching solution containing peroxodisulfate ions; and irradiating the surface of the wafer with a first light having a wavelength of 200 nm or more and less than 310 nm through the etching solution under a first irradiation condition, and irradiating with a second light having a wavelength of 310 nm or more and less than 365 nm under a second irradiation condition controlled independently of the first irradiation condition.

(Supplementary Description 2)

There is provided the structure manufacturing method according to the supplementary description 1, wherein the surface of the wafer is irradiated with the first light under a first light intensity condition, and is irradiated with the second light under a second light intensity condition controlled independently of the first light intensity condition.

(Supplementary Description 3)

There is provided the structure manufacturing method according to the supplementary description 1 or 2, wherein at least one of the first light and the second light is chopped light.

(Supplementary Description 4)

There is provided the structure manufacturing method according to any one of the supplementary descriptions 1 to 3, wherein both the first light and the second light are chopped lights.

(Supplementary Description 5)

There is provided the structure manufacturing method according to the supplementary description 4, wherein the surface of the wafer is irradiated with the first light under a first chopping condition, and is irradiated with the second light under a second chopping condition controlled independently of the first chopping condition.

(Supplementary Description 6)

There is provided the structure manufacturing method according to the supplementary description 4 or 5, wherein the first light and the second light have the same chopping frequency.

(Supplementary Description 7)

There is provided the structure manufacturing method according to the supplementary descriptions 6, wherein the first light and the second light are chopped in the same phase.

(Supplementary Description 8)

There is provided the structure manufacturing method according to the supplementary descriptions 6, wherein the first light and the second light are chopped in non-phase.

(Supplementary Description 9)

There is provided the structure manufacturing method according to the supplementary descriptions 4 or 5, wherein the first light and the second light have different chopping frequencies.

(Supplementary Description 10)

There is provided the structure manufacturing method according to any one of the supplementary descriptions 4 to 9, wherein the first light and the second light have the same chopping duty ratio.

(Supplementary Description 11)

There is provided the structure manufacturing method according to any one of the supplementary descriptions 4 to 9, wherein the first light and the second light have different chopping duty ratios.

(Supplementary Description 12)

There is provided the structure manufacturing method according to any one of the supplementary descriptions 1 to 11, wherein the surface of the wafer is irradiated with the first light, and is irradiated with the second light, in a state where the wafer is immersed in the etching solution so that the surface of the wafer is parallel to a surface of the etching solution.

(Supplementary Description 13)

There is provided the structure manufacturing method according to any one of the supplementary descriptions 1 to 12, wherein a distance from the surface of the wafer to the surface of the etching solution is 5 mm or more and 100 mm or less.

(Supplementary Description 14)

There is provided the structure manufacturing method according to any one of the supplementary descriptions 1 to 13, wherein the surface of the wafer is irradiated with the first light and the second light, in a state where the wafer and the etching solution is stationary.

(Supplementary Description 15)

There is provided the structure manufacturing method according to any one of the supplementary descriptions 1 to 14, wherein irradiation of at least one of the first light and the second light is performed perpendicularly to the surface of the wafer.

(Supplementary Description 16)

There is provided the structure manufacturing method according to any one of the supplementary descriptions 1 to 15, wherein irradiation of the first light is performed perpendicularly to the surface of the wafer.

(Supplementary Description 17)

There is provided the structure manufacturing method according to any one of the supplementary descriptions 1 to 16, wherein irradiation of both the first light and the second light is performed perpendicularly to the surface of the wafer.

(Supplementary Description 18)

There is provided the structure manufacturing method according to any one of the supplementary descriptions 1 to 17, wherein the surface of the wafer is irradiated with a third light having a wavelength of 365 nm or more and less than 600 nm together with the first light and the second light.

(Supplementary Description 19)

There is provided a structure manufacturing device, including:

a container that stores a wafer at least whose surface comprises Group III nitride crystal in a state of being immersed in an etching solution containing peroxodisulfate ions; and a light irradiation device that irradiates the surface of the wafer through the etching solution, with a first light having a wavelength of 200 nm or more and less than 310 nm under a first irradiation condition, and irradiates the surface of the wafer with a second light having a wavelength of 310 nm or more and less than 365 nm under a second irradiation condition controlled independently of the first irradiation condition.

(Supplementary Description 20)

There is provided the structure manufacturing device according to the supplementary description 19, wherein the light irradiation device irradiates the surface of the wafer with the first light under a first light intensity condition, and irradiates the second light under a second light intensity condition controlled independently of the first light intensity condition.

(Supplementary Description 21)

There is provided the structure manufacturing device according to the supplementary description 19 or 20, wherein the light irradiation device irradiates the surface of the wafer with the first light under a first chopping condition, and irradiates the surface of the wafer with the second light under a second chopping condition controlled independently of the first chopping condition.

(Supplementary Description 22)

There is provided the structure manufacturing device according to any one of the supplementary descriptions 19 to 21, wherein the light irradiation device includes a first light source that emits the first light, and a second light source that emits the second light, and the first light source is a light source that converts ultraviolet rays generated by plasma emission into light having a predetermined wavelength by a phosphor.

(Supplementary Description 23)

There is provided the structure manufacturing device according to any one of the supplementary descriptions 19 to 22, wherein the light irradiation device includes a first light source that emits the first light, and a second light source that emits the second light, and the second light source is a semiconductor light emitting element.

(Supplementary Description 24)

There is provided the structure manufacturing device according to any one of the supplementary descriptions 19 to 23, wherein the light irradiation device includes a first light source that emits the first light, and a second light source that emits the second light, and a plurality of the first light sources and the second light sources are alternately arranged in a plane.

(Supplementary Description 25)

There is provided the structure manufacturing device according to any one of the supplementary descriptions 19 to 24, wherein the light irradiation device irradiates the surface of the wafer with a third light having a wavelength of 365 nm or more and less than 600 nm together with the first light and the second light.

(Supplementary Description 26)

There is provided a light irradiation device, used to irradiate a surface of a wafer with light, the wafer being immersed in an etching solution containing hydroxide ions and peroxodisulfate ions, and at least whose surface comprises Group III nitride crystal, wherein the device irradiates the surface of the wafer through the etching solution, with a first light having a wavelength of 200 nm or more and less than 310 nm under a first irradiation condition, and irradiates the surface of the wafer with a second light having a wavelength of 310 nm or more and less than 365 nm under a second irradiation condition controlled independently of the first irradiation condition.

(Supplementary Description 27)

There is provided the light irradiation device according to the supplementary description 26, wherein the light irradiation device includes a first light source that emits the first light, and a second light source that emits the second light, and the first light source is a light source that converts ultraviolet rays generated by plasma emission into light having a predetermined wavelength by a phosphor.

(Supplementary Description 28)

There is provided the light irradiation device according to the supplementary description 26 or 27, wherein the light irradiation device includes a first light source that emits the first light, and a second light source that emits the second light, and the second light source is a semiconductor light emitting element.

(Supplementary Description 29)

There is provided the light irradiation device according to any one of the supplementary descriptions 26 to 28, wherein the light irradiation device includes a first light source that emits the first light, and a second light source that emits the second light, and a plurality of the first light sources and the second light sources are alternately arranged in a plane.

(Supplementary Description 30)

There is provided the light irradiation device according to any one of the supplementary descriptions 26 to 29, wherein the light irradiation device irradiates the surface of the wafer with a third light having a wavelength of 365 nm or more and less than 600 nm together with the first light and the second light.

DESCRIPTION OF SIGNS AND NUMERALS

41 Mask
100 Wafer
100s Wafer surface
111, 112, 113 Areas to be etched
121, 122, 123 Recesses
400 PEC etching device (structure manufacturing device)
410 Container
420 Etching solution
420s Surface of the etching solution
421 Etching solution above wafer
430 Light irradiation device
430, 430b, 430c Light source
431 UV light (light)
431a, 431b UV light
431c Light
440 Control device
451a, 451b Light intensity adjuster
452a, 452b Chopper
453 Half mirror
454 Member

The invention claimed is:

1. A structure manufacturing method, comprising:
preparing a wafer at least whose surface comprises Group III nitride crystal in a state of being immersed in an etching solution containing peroxodisulfate ions; and
irradiating the surface of the wafer with light through the etching solution;
wherein the group III nitride crystal has a composition in which holes are generated when irradiated with a light having a wavelength of 310 nm or more, and
during irradiation of the light, the surface of the wafer is irradiated with chopped light having a wavelength of 310 nm or more and having a wavelength that causes the holes to be generated in the Group III nitride crystal, through the etching solution in which $SO_4^{-*}$ radicals are generated, under a chopping condition controlled independently of the $SO_4^{-*}$ radical generation condition.

2. The structure manufacturing method according to claim 1, wherein during irradiation of the light, the method comprises alternately repeating:
generating an oxide of a Group III element contained in the Group III nitride crystal in an irradiation period of the chopped light on the surface of the wafer; and
dissolving the oxide generated in the irradiation period, in a non-irradiation period of the chopped light on the surface of the wafer.

3. A structure manufacturing device, comprising:
a container that stores a wafer at least whose surface comprises Group III nitride crystal in a state of being immersed in an etching solution containing peroxodisulfate ions; and
a light irradiation device that irradiates the surface of the wafer with light through the etching solution;
wherein the Group III nitride crystal has a composition in which holes are generated when irradiated with a light having a wavelength of 310 nm or more, and
the light irradiation device irradiates the surface of the wafer with chopped light having a wavelength of 310 nm or more and having a wavelength that causes the holes to be generated in the Group III nitride crystal through the etching solution in which $SO_4^{-}*$ radicals are generated, under a chopping condition controlled independently of the $SO_4^{-}*$ radical generation condition.

* * * * *